(12) United States Patent
Cao et al.

(10) Patent No.: US 11,302,247 B2
(45) Date of Patent: Apr. 12, 2022

(54) LED DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Pengjun Cao, Beijing (CN); Ming Zhai, Beijing (CN); Pei Li, Beijing (CN); Zhiyuan Wang, Beijing (CN); Jinpeng Li, Beijing (CN); Dan Li, Beijing (CN); Jian Li, Beijing (CN); Teng Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/961,761

(22) PCT Filed: Dec. 13, 2019

(86) PCT No.: PCT/CN2019/125098
§ 371 (c)(1),
(2) Date: Jul. 13, 2020

(87) PCT Pub. No.: WO2020/140727
PCT Pub. Date: Jul. 9, 2020

(65) Prior Publication Data
US 2021/0065618 A1   Mar. 4, 2021

(30) Foreign Application Priority Data
Jan. 4, 2019   (CN) .......................... 201910008987.4

(51) Int. Cl.
*G09G 3/32* (2016.01)
*H01L 25/075* (2006.01)
*H01L 33/62* (2010.01)

(52) U.S. Cl.
CPC ........... *G09G 3/32* (2013.01); *H01L 25/0753* (2013.01); *H01L 33/62* (2013.01); *G09G 2300/0452* (2013.01)

(58) Field of Classification Search
CPC ... H01L 33/62; H01L 25/0753; H01L 25/167; H01L 2224/49431; H01L 2224/49433;
(Continued)

(56) References Cited

U.S. PATENT DOCUMENTS 8,933,868 B2 * 1/2015 Choi ................... H01L 27/3269
                                                                345/82
9,614,014 B2 * 4/2017 Kim ....................... H01L 27/15
(Continued)

FOREIGN PATENT DOCUMENTS

CN   102760408 A       10/2012
CN   102931330   *    2/2013   .............. G09F 9/33
(Continued)

*Primary Examiner* — Vinh T Lam
(74) *Attorney, Agent, or Firm* — Nath, Goldberg & Meyer; Joshua B. Goldberg (57) ABSTRACT

The present disclosure provides a LED display device, which includes: a LED display substrate and a driving substrate opposite to each other, the LED display substrate includes: a base and a plurality of LED chips located on a side of the base distal to the driving substrate; the driving substrate includes: a PCB and a driving control element located on the PCB, and the driving control element is electrically coupled to the LED chips through a plurality of first signal wires for providing driving signals for the LED chips.

20 Claims, 5 Drawing Sheets

(58) Field of Classification Search
CPC ... G09G 2300/0452; G09G 2300/0426; G09G 3/32
See application file for complete search history.

(56) References Cited

U.S. PATENT DOCUMENTS

| | | | |
|---|---|---|---|
| 10,707,266 B2* | 7/2020 | Chang | H01L 33/62 |
| 10,720,412 B2* | 7/2020 | Hayashi | H01L 25/0753 |
| 2008/0001864 A1* | 1/2008 | Lee | H01L 51/5246 |
| | | | 345/82 |
| 2012/0001207 A1* | 1/2012 | Lee | H01L 51/5234 |
| | | | 257/89 |
| 2012/0075185 A1* | 3/2012 | Brug | H01L 27/326 |
| | | | 345/163 |
| 2014/0152636 A1* | 6/2014 | Yamada | H01L 27/3279 |
| | | | 345/211 |
| 2014/0232762 A1* | 8/2014 | Park | H01L 27/3265 |
| | | | 345/690 |
| 2014/0313112 A1* | 10/2014 | Madhusudan | G09G 3/3208 |
| | | | 345/83 |
| 2014/0362126 A1* | 12/2014 | Jeong | G09G 3/3233 |
| | | | 345/690 |
| 2015/0116295 A1* | 4/2015 | Pyon | G09G 3/3233 |
| | | | 345/211 |
| 2015/0253613 A1 | 9/2015 | Yoon et al. | |
| 2016/0035284 A1* | 2/2016 | Jung | G06F 1/1643 |
| | | | 345/206 |
| 2016/0163263 A1* | 6/2016 | Duan | G09G 3/325 |
| | | | 345/215 |
| 2016/0172340 A1* | 6/2016 | Lu | H01L 25/167 |
| | | | 257/89 |
| 2016/0210896 A1* | 7/2016 | Gil | H01L 51/00 |
| 2016/0240118 A1* | 8/2016 | Ray | G09G 3/003 |
| 2017/0179092 A1* | 6/2017 | Sasaki | G09G 3/006 |
| 2017/0358505 A1* | 12/2017 | Chang | H01L 25/167 |
| 2018/0102085 A1* | 4/2018 | Pan | G09G 3/2003 |
| 2018/0114775 A1* | 4/2018 | Ray | H01L 25/0655 |
| 2018/0166429 A1* | 6/2018 | Chong | H01L 27/15 |
| 2018/0190184 A1* | 7/2018 | Kim | H01L 27/3241 |
| 2018/0190615 A1* | 7/2018 | Pan | G06F 3/044 |
| 2018/0190712 A1* | 7/2018 | Xu | H01L 33/0012 |
| 2018/0358340 A1* | 12/2018 | Wong | H01L 33/504 |
| 2019/0043407 A1* | 2/2019 | Yang | G09G 3/3208 |
| 2019/0116670 A1* | 4/2019 | Anderson | H05K 1/021 |
| 2019/0123033 A1* | 4/2019 | Martin | H01L 25/0753 |
| 2019/0252461 A1* | 8/2019 | Lin | G09G 3/2003 |
| 2019/0333897 A1* | 10/2019 | Chen | H01L 25/0753 |
| 2019/0363069 A1* | 11/2019 | Ahmed | H01L 33/007 |
| 2020/0043901 A1* | 2/2020 | Ahmed | H01L 33/62 |
| 2020/0111391 A1* | 4/2020 | Chao | G02B 6/4298 |
| 2021/0202616 A1* | 7/2021 | Zhang | G09G 3/32 |

FOREIGN PATENT DOCUMENTS

| | | |
|---|---|---|
| CN | 102931330 A | 2/2013 |
| CN | 104217659 A | 12/2014 |
| CN | 105493204 A | 4/2016 |
| CN | 107978667 A | 5/2018 |
| CN | 109461386 A | 3/2019 |
| CN | 209525868 U | 10/2019 |

* cited by examiner

LED DISPLAY DEVICE

CROSS-REFERENCE TO RELATED APPLICATIONS

The present application is a U.S. National Stage Application under 35 U.S.C. § 371 of International Patent Application No. PCT/CN2019/125098, filed on Dec. 13, 2019, which claims priority to China Patent Application No. 201910008987.4, filed on Jan. 4, 2019, the disclosure of both which are incorporated by reference herein in entirety.

TECHNICAL FIELD

The present disclosure relates to the field of display technology, in particular to a LED display device.

BACKGROUND

A Light Emitting Diode (LED) display panel is a core element of a LED display device. The LED display panel includes: a printed circuit board (abbreviated as PCB), a LED chip and a driving control element packaged on the PCB. Signal wires are required to be provided on the PCB for providing signals to positive and negative poles of an LED.

SUMMARY

In some implementations, a LED display device is provided, which includes: a LED display substrate and a driving substrate opposite to each other; the LED display substrate includes: a base and a plurality of LED chips located on a side of the base distal to the driving substrate; the driving substrate includes: a PCB and a driving control element, the driving control element is located on the PCB, and the driving control element is electrically coupled to the plurality of LED chips through a plurality of first signal wires for providing driving signals for the LED chips.

In some implementations, the plurality of first signal wires are located on a side of the base distal to the driving substrate.

In some implementations, the LED display substrate further includes a plurality of first conductive coupling elements which are located on the base and electrically coupled to the plurality of first signal wires in a one-to-one correspondence; and the driving substrate further includes a plurality of second conductive coupling elements which are located on a side of the PCB facing the base and are electrically coupled to the driving control element; the plurality of second conductive coupling elements are electrically coupled to the plurality of first conductive coupling elements in a one-to-one correspondence.

In some implementations, the plurality of first conductive coupling elements are located on a side of the base facing the PCB, and the LED display substrate further includes a plurality of intermediate conductive coupling elements, the plurality of first conductive coupling elements are electrically coupled to the plurality of first signal wires through the plurality of intermediate conductive coupling elements respectively.

In some implementations, the plurality of intermediate conductive coupling elements include at least one of conductive adhesive, metal wires, and a FPC.

In some implementations, a surface of the base on a side facing the PCB includes a first selection area, a second selection area, a third selection area and a fourth selection area which are spaced apart from one another, the first selection area, the second selection area, the third selection area and the fourth selection area each have a selected number of first conductive coupling elements uniformly distributed therein, and the selected number of first conductive coupling elements in each of the first selection area, the second selection area, the third selection area and the fourth selection area are electrically coupled to a selected number of first signal wires through the intermediate conductive coupling elements, respectively.

In some implementations, the first selection area and the second selection area are respectively adjacent to two opposite edges of the surface on which the first selection area and the second selection area are located, and the third selection area and the fourth selection area are respectively adjacent to other two opposite edges of the surface on which the third selection area and the fourth selection area are located.

In some implementations, the LED display device further includes a protective adhesive layer, the protective adhesive layer covers the plurality of LED chips, the plurality of first signal wires, and a part of the plurality of intermediate conductive coupling elements located on a side of the base distal to the PCB.

In some implementations, the PCB includes a first central region and a first peripheral region surrounding the first central region, and the LED display substrate is located in the first central region of the PCB.

In some implementations, the second conductive coupling elements are located in the first peripheral region, and the plurality of first conductive coupling elements are electrically coupled to the plurality of second conductive coupling elements by conductive jumpers, respectively.

In some implementations, the LED display substrate includes a second central region and a second peripheral region, the plurality of LED chips are located in the second central region and the first conductive coupling elements are located in the second peripheral region, the second peripheral region includes a first selection area, a second selection area, a third selection area and a fourth selection area which are spaced apart from one another, the first selection area, the second selection area, the third selection area and the fourth selection area each have a selected number of first conductive coupling elements uniformly distributed therein, and the selected number of first conductive coupling elements in each of the first selection area, the second selection area, the third selection area and the fourth selection area are electrically coupled to a selected number of first signal wires through conductive jumpers respectively, and the first selection area and the second selection area are respectively adjacent to two opposite edges of the surface on which the first selection area and the second selection area are located, and the third selection area and the fourth selection area are respectively adjacent to other two opposite edges of the surface on which the third selection area and the fourth selection area are located.

In some implementations, the LED display device further includes a protective adhesive layer, the protective adhesive layer covers the plurality of LED chips, the plurality of first signal wires, the plurality of first conductive coupling elements, the plurality of second conductive coupling elements and the conductive jumpers.

In some implementations, the plurality of first signal wires include a plurality of first pole signal wires coupled to first poles of the plurality of LED chips, and a plurality of second pole signal wires coupled to second poles of the plurality of LED chips and all the plurality of first pole signal wires are located in a same layer, all the plurality of second pole signal wires are located in a same layer, and the plurality of first pole signal wires and the plurality of second pole signal wires are located in different layers.

In sonic implementations, the plurality of LED chips form a pixel array comprising a total of M*N pixel units in M rows and N columns, the numbers of the LED chips in the respective pixel units are the same, and different LED chips in a single pixel unit emit light of different colors, the plurality of first pole signal wires extend along a row direction of the pixel units, the plurality of second pole signal wires extend along a column direction of the pixel units. The first poles of the LED chips in each row of pixel units in the $1^{st}$ to the $m^{th}$ rows of the pixel units of the pixel array are coupled to a single first pole signal wire, and a plurality of first pole signal wires coupled with the $1^{st}$ to the $m^{th}$ rows of pixel units of the pixel array are electrically coupled to the first conductive coupling elements in the first selection area through corresponding coupling elements. The first poles of the LED chips in each row of pixel units in the $(m+1)^{th}$ to the $M^{th}$ rows of pixel units of the pixel array are coupled to a corresponding one of the plurality of first pole signal wires, and the first pole signal wires coupled with the $(m+1)^{th}$ to the $M^{th}$ rows of pixel units of the pixel array are electrically coupled to the first conductive coupling elements in the second selection area through corresponding coupling elements. The second poles of the LED chips emitting light of a same color in each column of pixel units in the $1^{st}$ to the $m^{th}$ rows of pixel units of the pixel array are coupled to a single second pole signal wire, and a plurality of the second pole signal wires coupled with the $1^{st}$ to the $m^{th}$ rows of pixel units of the pixel array are electrically coupled to the first conductive coupling elements in the third selection area through corresponding coupling elements. The second poles of the LED chips emitting light of a same color in each column of pixel units in the $(m+1)^{th}$ to the $M^{th}$ rows of pixel units of the pixel array are coupled to a single second pole signal wire, and a plurality of second pole signal wires coupled to the $(m+1)^{th}$ to the $M^{th}$ rows of pixel units of the pixel array are electrically coupled to the first conductive coupling elements in the fourth selection area through corresponding coupling elements, M and N are integer, and m is an integer smaller than M.

In some implementations, m=INT (M/2), INT (M/2) indicates rounding of the value of M/2.

In some implementations, each of the LED chips is an LED flip chip.

In some implementations, both the first conductive coupling elements and the second conductive coupling elements are pads.

In some implementations, the base is a glass substrate.

DETAILED DESCRIPTION

In order to enable those skilled in the art to better understand the technical solutions of the present disclosure, a display device provided by the present disclosure will be described in detail below with reference to the drawings.

A multi-layered design is typically used for fabricating signal wires on a PCB. Due to factors such as low dry film resolution, large dry film thickness, large copper thickness, and low accuracy of exposure and etching equipment, a width of a each of signal wire formed on the PCB is large (a minimum width for mass production is about 85 µm), which results in that large sized LED chips, to which the signal wires are to be coupled, are required. In addition, when signal wires need to be arranged between some adjacent LEDs, since the width of each of the signal wires to be arranged is large, which further results in a large distance between adjacent LED chips. In view of the above problems, it is difficult to realize high resolution of the LED display panel in the related art.

Figure 1:
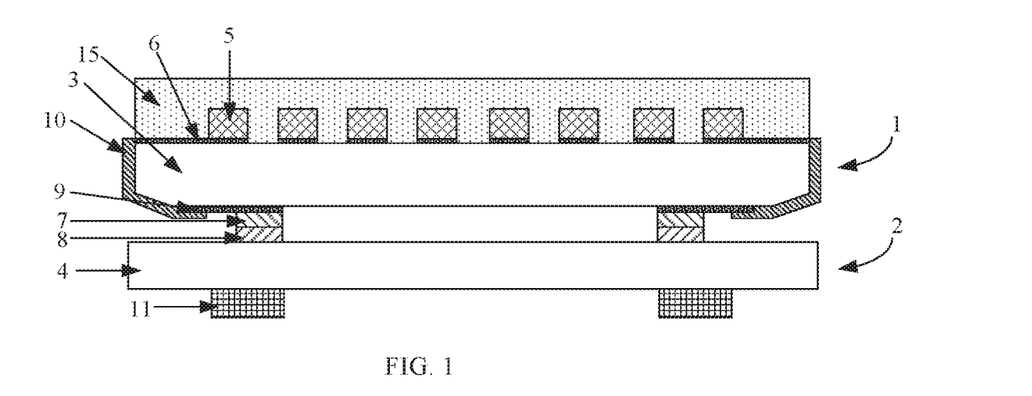
FIG. 1 is a schematic cross-sectional view of a display device in an embodiment of the present disclosure.

FIG. 1 is a schematic cross-sectional view of a display device in an embodiment of the disclosure. As shown in FIG. 1, the display device includes an LED display substrate 1 and a driving substrate 2 opposite to each other. The LED display substrate 1 includes a base 3 and a plurality of LED chips 5. The plurality of LED chips 5 are located on a side of the base 3 distal to the driving substrate 2. The LED display substrate 1 further includes a plurality of first signal wires 6 on a side of the base 3 distal to the driving substrate 2. For any one of the LED chips 5, a first pole and a second pole of the LED chip 5 are respectively coupled to two different first signal wires 6. In some implementations, the base 3 is a glass base, and the base 3 may be other bases suitable for the disclosed technical solution.

It should be noted, in the present disclosure, one of the first pole and the second pole of the LED chip 5 is a positive pole of the LED chip 5, and the other of the first pole and the second pole of the LED chip 5 is a negative pole of the LED chip 5. For convenience of description, the first pole of the LED chip 5 is exemplified as the positive pole, and the second pole of the LED chip 5 is exemplified as the negative pole in the present disclosure.

The driving substrate 2 includes a PCB 4 and a driving control element 11. The driving control element 11 is located on the PCB 4 and is usually packaged on a side of the PCB 4 distal to the glass base 3. The driving control element 11 is electrically coupled to the LED chips 5 through the first signal wires 6 respectively, and is configured to provide respective driving signals to the LED chips 5.

A packaging process for packaging the driving control element 11 on the PCB 4 belongs to a conventional technology, and the details thereof will not be described in detail herein.

In the present disclosure, the LED chips 5 and the first signal wires 6 for providing signals to the LED chips 5 are located on the glass base 3. When the first signal wires 6 are fabricated by a patterning process by using the glass base 3 as a base, the first signal wires 6 each having a small width may be fabricated since the patterning process performed on a thin film using the glass base 3 as the base has a high precision. It should be noted that the "patterning process" in the present disclosure includes processes such as photoresist coating, exposure, development, thin film etching, and photoresist stripping.

A process for fabricating the first signal wires 6 in the present disclosure includes a specific process as follows. First, a thin film of a conductive material, which may be a metal material (e.g., copper), is formed on a glass base 3 through a sputter process. A large adhesion force can be formed between the thin film of the conductive material formed by the sputter process and the glass base 3. In addition, a thickness of the thin film of the conductive material formed on the glass base 3 by using the above process may be much smaller than that of a copper foil formed by using a conventional technique. Then, a patterning process is performed on the thin film of the conductive material to obtain patterns of the first signal wires 6.

A minimum width of the first signal wire 6 fabricated by the above process is about 3 μm, which is much smaller than the minimum width of the signal wire fabricated on the PCB by the conventional technology.

Compared with the related art, the technical solution of the present disclosure can reduce the width of each of the first signal wires 6 for providing signals for the LED chips 5, and thus a size of each of the LED chips 5 coupled with the first signal wires 6 can also be reduced correspondingly, Meanwhile, a distance between the adjacent LED chips 5 on both sides of each of the first signal wires 6 can also be reduced. Therefore, in a region with a same area as the related art, the number of the LED chips 5 that can be arranged in the technical solution of the present disclosure is larger, which is beneficial to realize a high resolution of the LED display device.

In addition, as the size of the LED chip 5 used is reduced, the production cost can be reduced accordingly. Specifically, in a case that a pixel pitch is P1.0 (a distance between center points of two adjacent LED chips 5 is 1.0 mm), the minimum size of the LED chip 5 that can be used when the PCB is used as the base is 8 mil*12 mil, and the minimum size of the LED chip 5 that can be used when the glass base 3 is used as the base in the present disclosure is 4 mil.*8 mil. In terms of the cost of the LED chip, the cost of the LED chip per square meter on the PCB is about ¥37500, the cost of the LED chip per square meter on the glass base is about ¥12500, and the cost of the latter is about one third of that of the former.

In some implementations, the LED chip 5 may be a LED flip chip, The LED flip chip refers to a LED chip capable of being packaged on a base based on a flip-chip process. When the LED chip 5 is packaged on the base, a light emitting layer of the LED chip 5 is located on a side of the first pole and second pole distal to the base. The first pole and the second pole are in direct contact with the signal wires on the base, and in this way, since the first pole and the second pole are on a non-light-exiting side of the light emitting layer, the light emitting brightness of the LED cannot be influenced.

When a LED flip chip is adopted, all the LED chips 5 on the glass base 3 can be flip-packaged simultaneously. Specifically, after the first pole and the second pole of each of the LED chips 5 are electrically coupled to the corresponding first signal wires 6 (generally, the first pole and the second pole of said each of the LED chips 5 are weld to the corresponding signal wires), the entire side of the glass base 3 on which the LED chips 5 are provided is coated with a transparent silicone protective adhesive 15 having a certain thickness, The silicon protective adhesive 15 adopts professional LED packaging adhesive, which has excellent characteristics of good. heat resistance, weather resistance, ultraviolet aging resistance, light transmittance close to 100% and the like and can protect the LED flip chips without affecting the optical characteristics of the LED flip chips.

In the related art, when the PCB is used as the base, the LED chips used can only be an LED face-up chip (when it is packaged on the base, the first and second poles of the LED chip 5 are located on a side of the light emitting layer distal to the base) When the LED face-up chip is packaged on the PCB through a face-up packaging process, not only a protective adhesive 15 is needed, but also a support package and a metal bonding are needed, so that the face-up packaging process is complex and has high cost. In addition, since the first pole and the second pole of the LED chip are located on the light emitting side of the light emitting layer, the light emitted by the light emitting layer may be blocked, and the light emitting brightness of the LED chip may be affected.

It can be seen through the above-mentioned comparison that, in the disclosure, by using the LED flip chips, it can effectively reduce the difficulty of the packaging technology and packaging cost, and promote light emitting brightness, It should be noted that, the above case where LED flip chips are selected as the LED chips 5 is an embodiment in the present disclosure and does not limit the technical solution of the present disclosure.

In some implementations, each of the LED chips 5 is a Mini-LED chip. The Mini-LED chip is a LED chip with a length and a width ranging from 80 μm to 300 μm. The Mini-LED chip is generally a LED flip chip.

In the present disclosure, the LED display substrate 1 further includes a plurality of first conductive coupling elements 7 which are on the glass base 3 and are coupled to the plurality of first signal wires 6 in a one-to-one correspondence. The driving substrate 2 further includes a plurality of second conductive coupling elements 8 which are on a PCB 4 and are coupled to the plurality of first conductive coupling elements 7 in a one-to-one correspondence. The plurality of first conductive coupling elements 7 are respectively adapted and electrically coupled to the plurality of second conductive coupling elements 8, The driving control element 11 is electrically coupled to each second conductive coupling element 8. The driving control element 11 is specifically configured to provide corresponding driving signals to the LED chips 5 through the second conductive coupling elements 8, the first conductive coupling elements 7, and the first signal wires 6 sequentially.

In some implementations, the first conductive coupling elements 7 and the second conductive coupling elements 8 are pads, and the first conductive coupling elements 7 and the corresponding second conductive coupling elements 8 may be directly welded to each other for being coupled to each other, or may be electrically coupled to each other by other means (for example, one of each of the first conductive coupling elements 7 and each of the corresponding second conductive coupling elements 8 is a conductive plug, and the other is a conductive socket adapted to the conductive plug).

In some implementations, the second conductive coupling elements 8 are located on a side of the PCB 4 facing the glass base 3. The driving control element 11 is electrically coupled to the corresponding second conductive coupling elements 8 through via holes (not shown) in the PCB 4, In some implementations, the first conductive coupling elements 7 are located on a side of the glass base 3 facing the PCB 4. The LED display substrate 1 further includes a plurality of intermediate conductive coupling elements. The first conductive coupling elements 7 are coupled to the corresponding first signal wires 6 through the intermediate conductive coupling elements.

In some implementations, as shown in FIG. 1, the first conductive coupling elements 7 directly face the second conductive coupling elements 8, respectively, which facilitates the direct coupling between the first conductive coupling elements 7 and the second conductive coupling elements 8 respectively.

As an alternative embodiment, the first conductive coupling elements 7 and the second conductive coupling elements 8 are pads, and the first conductive coupling elements 7 and the second conductive coupling elements 8 are fixed to each other by welding, so that not only the electrical coupling between the first conductive coupling elements 7 and the second conductive coupling elements 8 can be achieved, but also an overall fixing between the LED display substrate 1 and the driving substrate 2 can be achieved.

Continuing to refer to FIG. 1, the first conductive coupling elements 7 are located on a surface of the glass base 3 facing the PCB 4. The LED display substrate 1 may further includes a plurality of second signal wires 9 corresponding to the plurality of first conductive coupling elements 7 one to one. The second signal wires 9 are located on a surface of the glass base 3 facing the PCB 4 and are respectively provided between the plurality of intermediate conductive coupling elements and the plurality of first conductive coupling elements 7. First ends of the second signal wires 9 are coupled to the corresponding first conductive coupling elements 7 respectively.

The second signal wires 9 may also be fabricated through a patterning process by using the glass base 3 as a base.

First ends of the first signal wires 6 extend to an edge of the surface of the glass base 3 distal to the PCB 4. The intermediate conductive coupling elements may include a conductive adhesive, which extends along side surfaces of the glass base 3 and establishes conductive adhesive channels 10 between the plurality of first signal wires 6 and the plurality of first conductive coupling elements 7 (or the plurality of second signal wires 9, if they exist). Each of the conductive adhesive channels 10 includes: a first portion located at the side surface of the glass base 3 and a second portion extending to the surface of the glass base 3 facing the PCB 4. The first portion of the conductive adhesive channel 10 is coupled to the first end of one first signal wire 6, and the second portion of the conductive adhesive channel 10 is coupled to a second end of one first conductive coupling element 7 (or one second signal wire 9, if it exists) corresponding to the one first signal wire 6 to which the first portion of the conductive adhesive channel 10 is coupled.

As an solution of the conductive adhesive, the conductive adhesive is conductive silver adhesive, In some implementations, since the conductive adhesive channel 10 needs to extend from the side surface of the glass base 3 to the surface of the glass base 3 facing the PCB 4, in order to reduce the risk that the conductive adhesive channel 10 is broken at the junction of the side surface of the glass base 3 and the surface of the glass base 3 facing the PCB 4, a chamfer is formed at the junction of the side surface of the glass base 3 provided with the conductive silver adhesive and the surface of the glass base 3 facing the PCB 4, so that the conductive adhesive channel 10 can smoothly transit from the side surface of the glass base 3 to the surface of the glass base 3 facing the PCB 4.

In this way, each second conductive coupling element 8 may be electrically coupled to the corresponding first signal wire 6 through the corresponding first conductive coupling element 7, the second signal wire 9 (if present), and the conductive adhesive channel 10.

Figure 2:
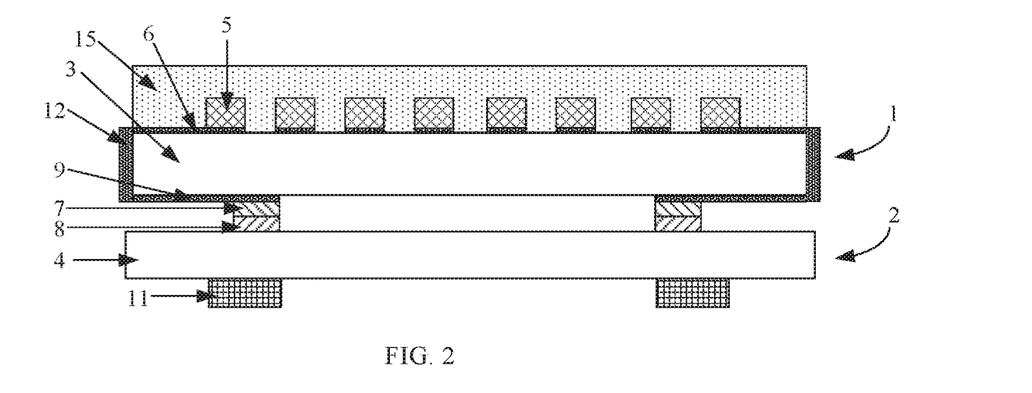
FIG. 2 is a schematic cross-sectional view of a display device in an embodiment of the present disclosure.

FIG. 2 is a schematic cross-sectional view of a display device according to an embodiment of the disclosure. As shown in FIG. 2, unlike those shown in FIG. 1, in the display device shown in FIG. 2, not only the first end of each of the first signal wires 6 extends to the edge of the surface of the glass base 3 distal to the PCB 4, but also the second end of the intermediate conductive coupling element (or the second signal wire 9, if present) extends to the edge of the surface of the glass base 3 facing the PCB 4, In this case, the intermediate conductive coupling elements include a plurality of metal wires 12. Each of the plurality of metal wires 12 extends along the side surface of the glass base 3 to electrically couple the plurality of first signal wires 6 with the plurality of first conductive coupling elements 7 (or the plurality of second signal wires 9, if present) respectively. That is, a first end of each of the metal wires 12 is coupled to a first end of one first signal wire 6, and a second end of said each of the metal wires 12 is coupled to one first conductive coupling element 7 (or the second end of the second signal wire 9) corresponding to the one first signal wire 6 to which the first end of the metal wire 12 is coupled.

The metal wires 12, the first signal wires 6 and the second signal wires 9 are made of a same material. Alternatively, the metal wires 12, the first signal wires 6 and the second signal wires 9 each are copper wires which have high conductivity and low production cost.

Figure 3:
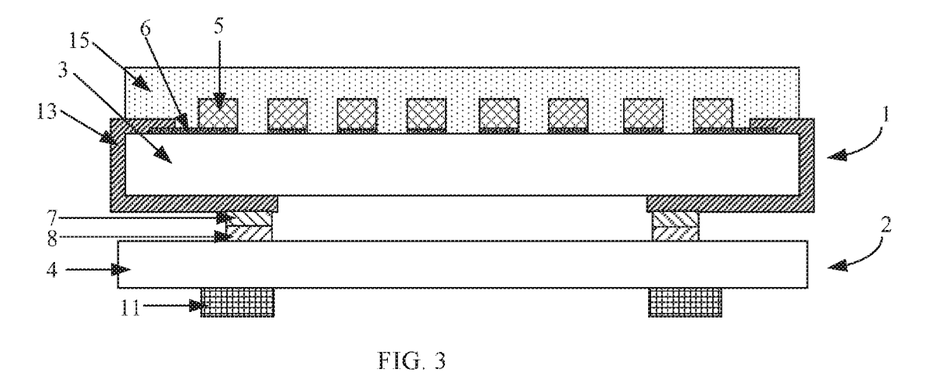
FIG. 3 is a schematic cross-sectional view of a display device in an embodiment of the present disclosure.

FIG. 3 is a schematic cross-sectional view of a display device in an embodiment of the disclosure. As shown in FIG. 3, unlike those shown in FIGS. 1 and 2, the intermediate conductive coupling member in FIG. 3 includes a FPC 13, and the FPC 13 is bent along the side surface of the glass base 3 and extends to the side of the glass base 3 facing the PCB 4. The first conductive coupling elements 7 are located on the FPC 13. Specifically, the FPC 13 includes a plurality of conductive channels in parallel, and first ends of the conductive channels are coupled to the first ends of the first signal wires 6 respectively. Specifically, first ends of the conductive channels are coupled to the first ends of the first signal wires 6 respectively through a bonding process, and second ends of the conductive channels are coupled to the first conductive coupling elements 7 corresponding to the respective first signal wires 6 coupled to the first ends of the conductive channels. The second ends of the conductive channels are located at a portion of the FPC 13 that is bent to the side of the glass base 3 facing the PCB 4. The first conductive coupling elements 7 are located on the side of the FPC 13 facing the PCB 4 and are coupled to the second ends of the conductive channels on the FPC 4. The first conductive coupling elements 7 may be directly located at the second ends of the respective conductive channels and face one surface of the PCB 4.

In the solution shown in FIG. 3, since the second signal wires 9 does not need to be fabricated, the production process steps can be reduced, and the production cycle can be shortened. Also, the number of FPCs used may be selected according to the number of first signal wires 6 and the number of conductive channels on the FPC 14, i.e., a plurality of FPCs 14 may be selected.

Figure 4:
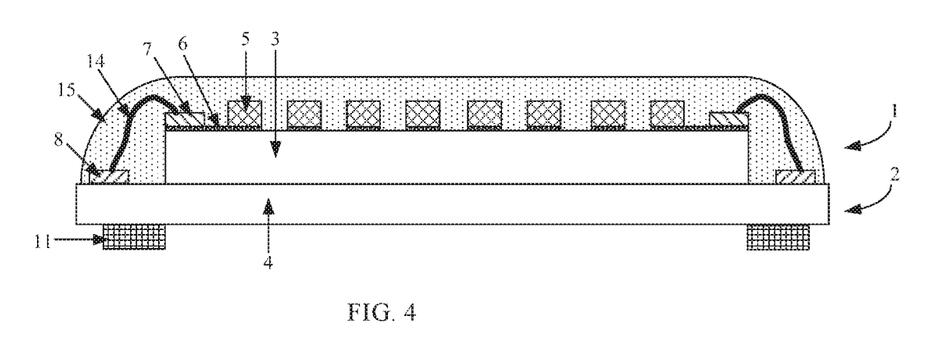
FIG. 4 is a schematic cross-sectional view of a display device in an embodiment of the present disclosure.
Figure 5:
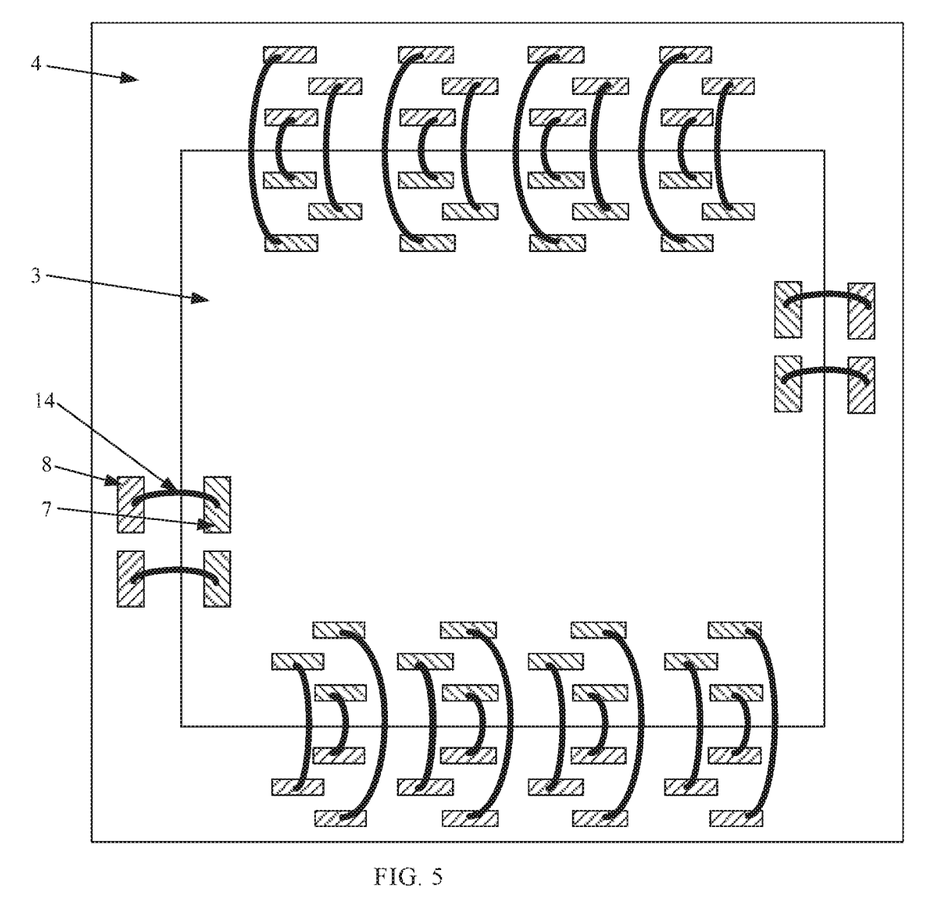
FIG. 5 is a schematic view of an arrangement of first conductive coupling elements and second conductive coupling elements in the display device shown in FIG. 4.

FIG. 4 is a schematic cross-sectional view of a display device in an embodiment of the disclosure, and FIG. 5 is a schematic view of an arrangement of the first conductive coupling elements and the second conductive coupling elements in the display device shown in FIG. 4. As shown in FIGS. 4 and 5, unlike those shown in FIGS. 1 to 3, a size of the glass base 3 in FIG. 4 is smaller than that of the PCB 4, i.e., the PCB 4 includes a first central region in which the LED display substrate 1 is located and a first peripheral region surrounding the first central region, The surface of the glass base 3 facing the PCB 4 is bonded to the surface of the PCB 4 facing the glass base 3. The driving control element 11 is located on the side of the PCB 4 distal to the glass base 3, The second conductive coupling elements 8 are located in the first peripheral region of the PCB 4. The LED display substrate 1 includes a second central region in which the plurality of LED chips 5 are located and a second peripheral region in which the first conductive coupling elements 7 are located. The first conductive coupling elements 7 are electrically coupled to the second conductive coupling elements 8 through conductive jumpers 14 respectively. In some implementations, the conductive jumpers 14 are gold wires.

Referring to FIG. 5, the second peripheral region includes a first selection area, a second selection area, a third selection area and a fourth selection area that are spaced apart from one another. A selected number of first conductive coupling elements 7 are evenly arranged in each of the first selection area, the second selection area, the third selection area and the fourth selection area, and the selected number of first conductive coupling elements 7 in each selection area are electrically coupled to the selected number of first signal wires, respectively, through conductive jumpers 14. The first selection area and the second selection area are respectively adjacent to two opposite edges of the surface where the first selection area and the second selection area are located, and the third selection area and the fourth selection area are respectively adjacent to two other opposite edges of the surface where the third selection area and the fourth selection area are located. That is, the first conductive coupling elements 7 are located on the surface of the glass base 3 distal to the PCB 4 and near the edge of the surface where the second conductive coupling elements 8 corresponding to the first conductive coupling elements 7 are located, so that the distance between the first conductive coupling element 7 and the second conductive coupling element 8 corresponding to the first conductive coupling element 7 can be effectively shortened, a length of the conductive jumper 14 required is reduced, the resistance of the conductive jumper 14 can be reduced, and the production cost can be reduced.

It should be noted that in the display device shown in FIG. 4, when the LED chips 5 are packaged with the protective adhesive 15, the second conductive coupling elements 8 and the conductive jumpers 14 may be packaged together to protect the second conductive coupling elements 8 and the conductive jumpers 14.

Figure 6:
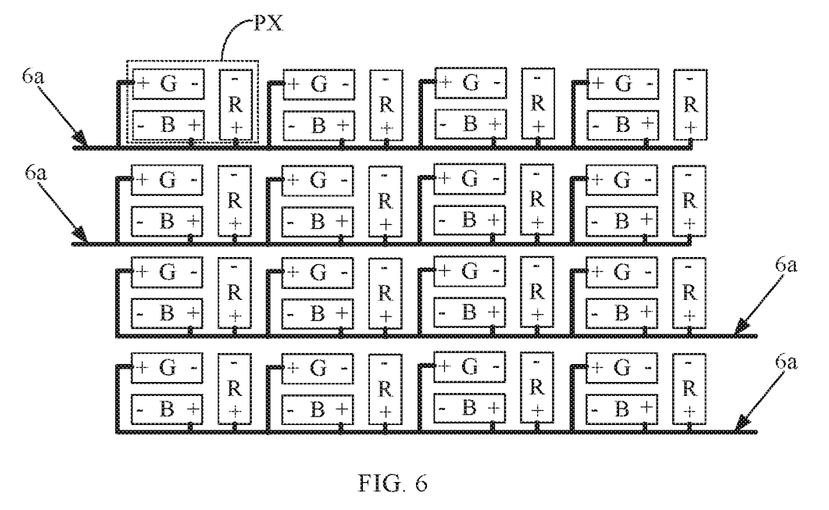
FIG. 6 is a schematic view of an arrangement of LED chips and first pole signal wires in an embodiment of the present disclosure.
Figure 7:
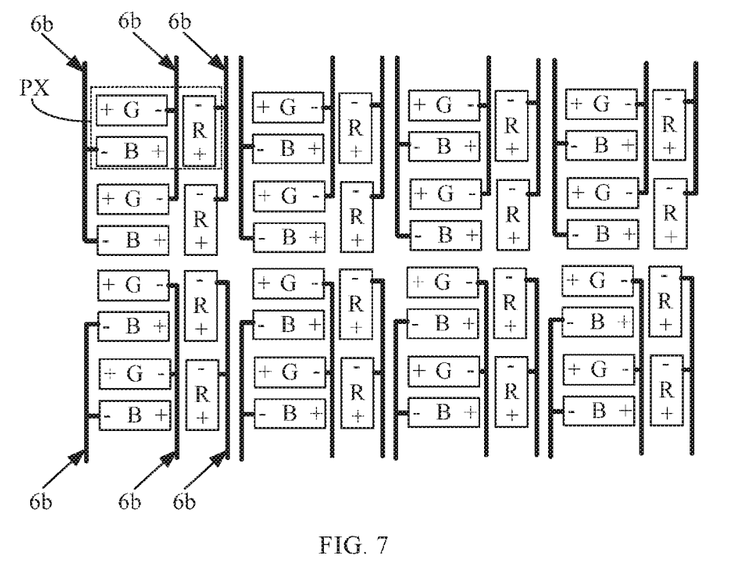
FIG. 7 is a schematic view of an arrangement of LED chips and second pole signal wires in an embodiment of the present disclosure.

FIG. 6 is a schematic view of an arrangement of LED chips and first pole signal wires in an embodiment of the present disclosure, and FIG. 7 is a schematic view of an arrangement of LED chips and second pole signal wires in an embodiment of the present disclosure. As shown in FIG. 6 and FIG. 7, In some implementations, the plurality of first signal wires 6 includes a plurality of first pole signal wires 6a and a plurality of second pole signal wires 6b. The first signal wires 6 coupled to the first poles of all the LED chips (including the LED chip (R) emitting red light, the LED chip (G) emitting green light, and the LED chip (B) emitting blue light)) are the first pole signal wires 6a, and the first signal wires 6 coupled to the second poles of all the LED chips are the second pole signal wires 6b. All the first pole signal wires 6a are arranged in a same layer, all the second pole signal wires 6b are arranged in a same layer, and the first pole signal wires 6a and the second pole signal wires 6b are arranged in different layers. An insulating layer is provided between the layer where the first pole signal wires 6 are located and the layer where the second pole signal wires 6b are located.

In some implementations, all of the LED chips form a pixel array including NI rows and N columns of a total of M*N pixel units. Each of the pixel units includes the same number of the LED chips, and different LED chips in a single pixel unit emit different color light. For example, three LED chips are included in each pixel unit, and the three LED chips respectively emit red light, green light, and blue light. The plurality of first pole signal wires 6a extend along a row direction of the pixel units, and the plurality of second pole signal wires 6b extend along a column direction of the pixel units.

Referring to FIG. 6, in the pixel array, the first poles of the LED chips R/G/B in the pixel units in a same row are coupled to a single first pole signal wire 6a, and the LED chips R/G/B in the pixel units in different rows are coupled to different first pole signal wires 6a.

Referring to FIG. 7, in the $1^{st}$ row to $M^{th}$ row of pixel units of the pixel array, the second poles of the LED chips R/G/B that are located in a same column of pixel units and emit light of a same color are coupled to a single second pole signal wire 6b, and the second poles of the LED chips R/G/B located in different columns of pixel units are coupled to different second pole signal wires 6b. M and N are integers, and m is an integer less than M.

In the $(m+1)^{th}$ row to the $M^{th}$ row of pixel units of the pixel array, the second poles of the LED chips R/G/B which are in a same column of pixel units and emit light of a same color are coupled to a single second pole signal wire 6b, and the second poles of the LED chips R/G/B in different columns of pixel units are coupled to different second pole signal wires 6b.

The second pole signal wires 6b coupled to the second poles of the LED chips R/G/B in the pixel units of the row to the $m^{th}$ row are different from the second pole signal wires 6b coupled to the second poles of the LED chips 5 in the pixel units of the $(m+1)^{th}$ row to the $m^{th}$ row.

It should be noted that, the figures only schematically illustrates a case where the pixel array includes 16 pixel units PX with 4 rows and 4 columns, and each pixel unit PX includes three LED chips R/G/B, and the three LED chips R/G/B include a red LED chip R, a green LED chip G, and a blue LED chip B, which does not limit the technical solution of the present disclosure. In addition, in one pixel unit, the green LED chip G and the blue LED chip B are arranged in a column direction, and the green LED chip G and the blue LED chip B are located on the left side of the red LED chip R, which is only illustrative and does not limit the technical solution of the present disclosure. In the present disclosure, the number of the LED chips included in one pixel unit and the arrangement of the LED chips are not limited.

Taking the cases shown in FIG. 6 and FIG. 7 as an example, the pixel array includes 3M*N LED chips R/G/B, and M first pole signal wires 6a and 6N second pole signal wires 6B are required.

In some implementations, m=INT (M/2), where INT (M/2) denotes to round the value of M/2.

The first ends of the first pole signal wires 6a coupled to the LED chips R/G/B in the pixel units of the row to the $1^{th}$ row extends to a first side edge of the surface of the glass base 3 distal to the PCB4 (being coupled to the first conductive coupling elements in the corresponding first selection area through corresponding coupling elements). The first ends of the first pole signal wires 6a coupled to the LED chips R/G/B in the pixel units of the $(m+1)^{th}$ row to the $M^{th}$ row extends to a second side edge of the surface of the glass base 3 distal to the PCB4 (being coupled to the first conductive coupling elements in the corresponding second selection area through corresponding coupling elements). The first ends of the second pole signal wires 6b coupled to the LED chips R/G/B in the pixel units of the row to the $m^{th}$ row extends to a third side edge of the surface of the glass base 3 distal to the PCB4 (being coupled to the first conductive coupling elements in the corresponding third selection area through corresponding coupling elements). The first ends of the second pole signal wires 6b coupled to the LED chips R/G/B in the pixel units of the $(m+1)^{th}$ row to the $M^{th}$ row extends to a fourth side edge of the surface of the glass base 3 distal to the PCB4 (being coupled to the first conductive coupling elements in the corresponding fourth selection area through corresponding coupling elements). The first side edge and the second side edge are opposite side edges in the row direction, and the third side edge and the fourth side edge are opposite side edges in the column direction.

In the figures, the first side edge and the second side edge are respectively a left side edge and a right side edge in the figures, and the third side edge and the fourth side edge are respectively an upper side edge and a lower side edge in the figures.

In this way, the first signal wires 6 are led out from the four side edges of the glass base 3. Specifically, among the M first pole signal wires 6a, half of the first pole signal wires 6a are led out from the left side edge of the glass base 3, and the other half of the first pole signal wires 6a are led out from the right side edge of the glass base 3. Among the 6N second pole signal wires 6b, half of the second pole signal wires 6b are led out from the upper side edge of the glass base 3, and the other half of the second pole signal wires 6b are led out from the lower side edge of the glass base 3.

Based on the above wiring manner, the number of wires in the left side edge area of the glass base 3 is equal to the number of wires in the right side edge area of the glass base 3, and the number of wires in the upper side edge area of the glass base 3 is equal to the number of wires in the lower side edge area of the glass base 3, thereby electively improving the wiring uniformity of the edge areas of the glass base 3.

In addition, the second pole signal wires 6b are respectively provided in an upper half area and a lower half area of the display substrate to perform signal transmission, so that a length of each of the second pole signal wires 6b can be effectively shortened, the resistance of each of the second electrode pole signal wires 6b can be reduced, and the signal transmission quality of the second pole signal wires 6b can be improved.

Figure 8:
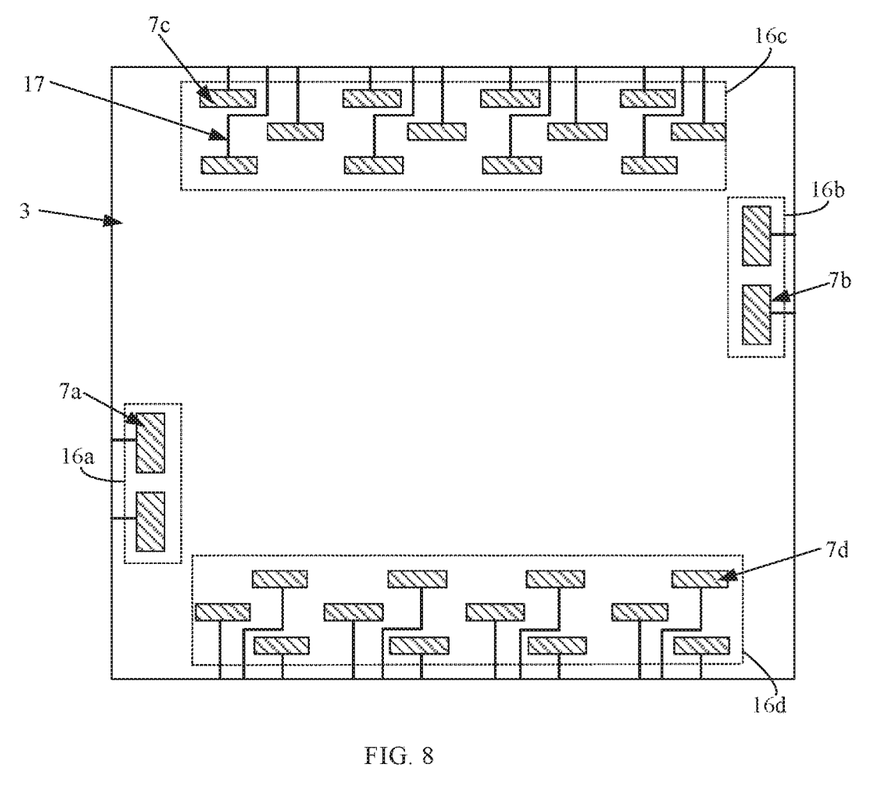
FIG. 8 is a schematic view of an arrangement of first conductive coupling elements in an embodiment of the present disclosure.

FIG. 8 is a top view of the first conductive coupling elements in the present disclosure. As shown in FIG. 8, further, when the first conductive coupling elements 7 are provided in the LED display substrate 1 and the first conductive coupling elements 7 are located on a surface of the glass base 3 facing the PCB 4 (i.e. the LED display substrate 1 is the LED display substrate 1 in the display device shown in FIGS. 1 and 2), the first conductive coupling elements 7 may be arranged as follows.

The surface of the glass base 3 facing the PCB 4 includes at least a first selection area, a second selection area, a third selection area and a fourth selection area, which are spaced apart from each other. Each of the first selection area, the second selection area, the third selection area and the fourth selection area is uniformly provided with a selected number of first conductive coupling elements, and the selected number of first conductive coupling elements in each selection area are electrically coupled to a selected number of first signal wires through corresponding intermediate conductive coupling elements (or through the intermediate conductive coupling elements and the second signal wires), respectively. The first selection area and the second selection area are located on the surface of the glass base 3 facing the PCB 4 and adjacent to opposite side edges of the glass base 3. The first selection area and the second selection area are respectively adjacent to two opposite edges of the surface where the first selection area and the second selection area are located, in other words, the third selection area and the fourth selection area are located on the surface of the glass base 3 facing the PCB 4 and adjacent to other opposite side edges of the glass base 3. The third selection area and the fourth selection area are respectively adjacent to other two opposite edges of the surface on which the third selection area and the fourth selection area are arranged. The two opposite edges (along the row direction of the pixel array) of the glass substrate adjacent to the first selection area and the second selection area are different from other two opposite edges (along the column direction of the pixel array) of the glass substrate adjacent to the third selection area and the fourth selection area.

Referring to FIG. 8, the first conductive coupling elements 7a, corresponding to the first pole signal wires 6a coupled to the LED chips 5 in pixel units of the $1^{th}$ row to $M^{th}$ row, are in the first selection area 16a which is on the surface of the glass base 3 facing the PCB 4 and adjacent to the first side edge of the glass base 3. The first conductive coupling elements 7b, corresponding to the first pole signal wires 6a coupled to the LED chips 5 in the pixel units of the $(m+1)^{th}$ row to the $M^{th}$ row are in the second selection area 16b which is on the surface of the glass base 3 facing the PCB 4 and adjacent to the second side edge of the glass base 3. The first conductive coupling elements 7c, corresponding to the second pole signal wires 6b coupled to the LED chips 5 in the pixel units of the row to $m^{th}$ row, are in a third selection area 16c which is on the surface of the glass base 3 facing the PCB 4 and adjacent to the third side edge of the glass base 3. The first conductive coupling elements 7d, corresponding to the second pole signal wires fib coupled to the LED chips 5 in the pixel units of the $(m+1)^{th}$ row to the $M^{th}$ row is in the fourth selection area 16d which is on the surface of the glass base 3 facing the PCB 4 and adjacent to the fourth side edge of the glass base 3.

In the present disclosure, the first ends of the first signal wires 6 electrically coupled to the first conductive coupling elements 7a/7b/7c/7d and the first conductive coupling elements 7a/7b/7c/7d are provided at same side edges of the glass base 3 respectively, so that the length of each of the intermediate conductive coupling elements 17 for electrically coupling the first ends of the first signal wires 6 with the corresponding first conductive coupling elements 7a/7b/7c/7d can be effectively shortened, thereby reducing the production cost.

In addition, when the first conductive coupling elements 7a/7b/7c/7d on the glass base 3 are coupled to the second conductive coupling elements 8 on the PCB 4, the four side edges of the glass base 3 are all fixed to the PCB 4, so that the firmness of the attachment between the LED display substrate I and the driving substrate 2 can be improved.

Furthermore, in some implementations, all the first conductive coupling elements 7a located on the side of the glass base 3 facing the PCB 4 and adjacent to the first side edge of the glass base 3 are uniformly arranged in the first selection area 16a.

All the first conductive coupling elements 7b located on the side of the glass base 3 facing the PCB 4 and adjacent to the second side edge of the glass base 3 are uniformly arranged in the second selection area 16b.

All the first conductive coupling elements 7c located on the side of the glass base 3 facing the PCB 4 and adjacent to the third side edge of the glass base 3 are uniformly arranged within the third selection area 16c.

All the first conductive coupling elements 7d located on the side of the glass base 3 facing the PCB 4 and adjacent to the fourth side edge of the glass base 3 are uniformly arranged in the fourth selection area 16d.

In the present disclosure, the first conductive coupling elements 7a/7b/7c/7d in the respective selection areas may be uniformly arranged by uniformly arranging all the first conductive coupling elements 7a adjacent to the first side edge in the first selection area 16a, uniformly arranging all the first conductive coupling elements 7b adjacent to the second side edge in the second selection area 16b, uniformly arranging all the first conductive coupling elements 7c adjacent to the third side edge in the third selection area 16c, and uniformly arranging all the first conductive coupling elements 7d adjacent to the fourth side edge in the fourth selection area 16d. By thus design, a size of each of the first conductive coupling elements 7a/7b/7c/7d may be enlarged, so that the problem of short circuit or virtual connection due to alignment deviation between the glass base 3 and the PCB 4 can be solved.

It should be noted that, as shown in FIG. 8, in the first selection area 16a and the second selection area 16b, the first conductive coupling elements 7a/7b are arranged in a column direction and the distances between adjacent first conductive coupling elements are equal to each other, which is only an implementation to achieve uniform arrangement, and does not limit the technical solution of the present disclosure.

In addition, as shown in FIG. 8, in the third selection area 16c and the fourth selection area 16d, the first conductive coupling elements 7c/7d are arranged in three rows, and the first conductive coupling elements in adjacent rows are staggered, which is only an implementation to achieve uniform arrangement and does not limit the technical solution of the present disclosure.

It should be noted that, when the LED display substrate 1 is the LED display substrate 1 in the display device shown in FIG. 4, the arrangement of the first conductive coupling elements located on the side of the LED display substrate distal to the PCB 4 may also be arranged as shown in FIG. 8, and the difference is that the first selection area, the second selection area, the third selection area, and the fourth selection area are located in the second peripheral area of the LED display substrate 1, which is not described herein again.

In addition, the display substrate in the disclosure can include a plurality of LED display substrates, and the plurality of LED display substrates are located on a same plane to form a spliced LED display device. Similarly, there may be one or more driving substrates. Alternatively, there may be one driving substrate, and the plurality of LED display substrates correspond to a single large-sized driving substrate. Alternatively, there are a plurality of driving substrates, and the plurality of LED display substrates correspond to the plurality of driving substrates in one-to-one correspondence. Other cases will not be described here by way of example.

When the number of the LED display substrates is multiple, the LED display substrates can be packaged by using a single layer of protective adhesive.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A LED display device, comprising: a LED display substrate and a driving substrate opposite to each other; wherein
    the LED display substrate comprises: a base and a plurality of LED chips located on a side of the base distal to the driving substrate;
    the driving substrate comprises: a PCB and a driving control element, wherein the driving control element is located on the PCB, and the driving control element is electrically coupled to the plurality of LED chips through a plurality of first signal wires for providing driving signals for the LED chips,
    wherein the plurality of first signal wires are located on a side of the base distal to the driving substrate,
    the LED display substrate further comprises a plurality of first conductive coupling elements and a plurality of intermediate conductive coupling elements, the plurality of first conductive coupling elements are located on a side of the base facing the PCB and electrically coupled to the plurality of first signal wires in a one-to-one correspondence, and the plurality of intermediate conductive coupling elements extend along a side surface of the base,
    the driving substrate further comprises a plurality of second conductive coupling elements which are located on a side of the PCB facing the base and are electrically coupled to the driving control element, and
    the plurality of first conductive coupling elements are electrically coupled to the plurality of first signal wires through the plurality of intermediate conductive coupling elements, respectively.

2. The LED display device of claim 1, wherein the plurality of intermediate conductive coupling elements comprise at least one of conductive adhesive, metal wires, and a FPC.

3. The LED display device of claim 1, wherein a surface of the base facing the PCB comprises a first selection area, a second selection area, a third selection area, and a fourth selection area which are spaced apart from one another,
    wherein the first selection area, the second selection area, the third selection area and the fourth selection area each have a selected number of first conductive coupling elements uniformly distributed therein, and the selected number of first conductive coupling elements in each of the first selection area, the second selection area, the third selection area and the fourth selection area are electrically coupled to a selected number of first signal wires through the intermediate conductive coupling elements, respectively.

4. The LED display device of claim 3, wherein
    the first selection area and the second selection area are respectively adjacent to two opposite edges of the surface on which the first selection area and the second selection area are located, and the third selection area and the fourth selection area are respectively adjacent to other two opposite edges of the surface on which the third selection area and the fourth selection area are located.

5. The LED display device of claim 1, further comprising a protective adhesive layer, wherein the protective adhesive layer covers the plurality of LED chips, the plurality of first signal wires, and a part of the plurality of intermediate conductive coupling elements located on a side of the base distal to the PCB.

6. The LED display device of claim 4, wherein the plurality of first signal wires comprise a plurality of first pole signal wires coupled to first poles of the plurality of LED chips, and a plurality of second pole signal wires coupled to second poles of the plurality of LED chips; and
all the plurality of first pole signal wires are located in a same layer, all the plurality of second pole signal wires are in located a same layer, and the plurality of first pole signal wires and the plurality of second pole signal wires are located in different layers.

7. The LED display device of claim 6, wherein the plurality of LED chips form a pixel array comprising a total of M*N pixel units in M rows and N columns, the numbers of the LED chips in the respective pixel units are the same, and different LED chips in a single pixel unit emit light of different colors, the plurality of first pole signal wires extend along a row direction of the pixel units, the plurality of second pole signal wires extend along a column direction of the pixel units,
the first poles of the LED chips in each row of pixel units in the $1^{st}$ to the $m^{th}$ rows of the pixel units of the pixel array are coupled to a single first pole signal wire, and a plurality of first pole signal wires coupled with the $1^{st}$ to the $m^{th}$ rows of pixel units of the pixel array are electrically coupled to the first conductive coupling elements in the first selection area through corresponding coupling elements;
the first poles of the LED chips in each row of pixel units in the $(m+1)^{th}$ to the $M^{th}$ rows of pixel units of the pixel array are coupled to a corresponding one of the plurality of first pole signal wires, and the first pole signal wires coupled with the $(m+1)^{th}$ to the $M^{th}$ rows of pixel units of the pixel array are electrically coupled to the first conductive coupling elements in the second selection area through corresponding coupling elements;
the second poles of the LED chips emitting light of a same color in each column of pixel units in the $1^{st}$ to the $m^{th}$ rows of pixel units of the pixel array are coupled to a single second pole signal wire, and a plurality of the second pole signal wires coupled with the $1^{st}$ to the $m^{th}$ rows of pixel units of the pixel array are electrically coupled to the first conductive coupling elements in the third selection area through corresponding coupling elements;
the second poles of the LED chips emitting light of a same color in each column of pixel units in the $(m+1)^{th}$ to the $M^{th}$ rows of pixel units of the pixel array are coupled to a single second pole signal wire, and a plurality of second pole signal wires coupled to the $(m+1)^{th}$ to the $M^{th}$ rows of pixel units of the pixel array are electrically coupled to the first conductive coupling elements in the fourth selection area through corresponding coupling elements, wherein M and N are integer, and m is an integer smaller than M.

8. The LED display device of claim 7, wherein m=INT (M/2), INT (M/2) indicates rounding of a value of M/2.

9. The LED display device of claim 1, wherein each of the LED chips is an LED flip chip.

10. The LED display device of claim 1, wherein the first conductive coupling elements and the second conductive coupling elements are pads.

11. The LED display device of claim 1, wherein the base is a glass substrate.

12. The LED display device of claim 1, wherein each of the plurality of intermediate conductive coupling elements extends to the side of the base facing the PCB.

13. The LED display device of claim 12, further comprising a plurality of second signal wires on the side of the base facing the PCB, wherein the plurality of first conductive coupling elements are electrically coupled to the plurality of intermediate conductive coupling elements through the plurality of second signal wires, respectively.

14. A LED display device, comprising: a LED display substrate and a driving substrate opposite to each other; wherein
the LED display substrate comprises: a base and a plurality of LED chips located on a side of the base distal to the driving substrate;
the driving substrate comprises: a PCB and a driving control element, wherein the driving control element is located on the PCB, and the driving control element is electrically coupled to the plurality of LED chips through a plurality of first signal wires for providing driving signals for the LED chips,
wherein a surface of the base comprises a first selection area, a second selection area, a third selection area, and a fourth selection area which are spaced apart from one another,
the first selection area, the second selection area, the third selection area and the fourth selection area each have a selected number of first conductive coupling elements uniformly distributed therein, and the selected number of first conductive coupling elements in each of the first selection area, the second selection area, the third selection area and the fourth selection area are electrically coupled to a selected number of first signal wires, respectively,
the first selection area and the second selection area are respectively adjacent to two opposite edges of the surface on which the first selection area and the second selection area are located, and the third selection area and the fourth selection area are respectively adjacent to other two opposite edges of the surface on which the third selection area and the fourth selection area are located,
the plurality of first signal wires comprise a plurality of first pole signal wires coupled to first poles of the plurality of LED chips, and a plurality of second pole signal wires coupled to second poles of the plurality of LED chips,
the plurality of LED chips form a pixel array comprising a total of M*N pixel units in M rows and N columns, the numbers of the LED chips in the respective pixel units are the same, and different LED chips in a single pixel unit emit light of different colors, the plurality of first pole signal wires extend along a row direction of the pixel units, the plurality of second pole signal wires extend along a column direction of the pixel units,
the first poles of the LED chips in each row of pixel units in the 1st to the mth rows of the pixel units of the pixel array are coupled to a single first pole signal wire, and a plurality of first pole signal wires coupled with the 1st to the mth rows of pixel units of the pixel array are electrically coupled to the first conductive coupling elements in the first selection area through corresponding coupling elements;

the first poles of the LED chips in each row of pixel units in the (m+1)th to the Mth rows of pixel units of the pixel array are coupled to a corresponding one of the plurality of first pole signal wires, and the first pole signal wires coupled with the (m+1)th to the Mth rows of pixel units of the pixel array are electrically coupled to the first conductive coupling elements in the second selection area through corresponding coupling elements;

the second poles of the LED chips emitting light of a same color in each column of pixel units in the 1st to the mth rows of pixel units of the pixel array are coupled to a single second pole signal wire, and a plurality of the second pole signal wires coupled with the 1st to the mth rows of pixel units of the pixel array are electrically coupled to the first conductive coupling elements in the third selection area through corresponding coupling elements; and the second poles of the LED chips emitting light of a same color in each column of pixel units in the (m+1)th to the Mth rows of pixel units of the pixel array are coupled to a single second pole signal wire, and a plurality of second pole signal wires coupled to the (m+1)th to the Mth rows of pixel units of the pixel array are electrically coupled to the first conductive coupling elements in the fourth selection area through corresponding coupling elements, wherein M and N are integer, and m is an integer smaller than M.

15. The LED display device of claim 14, wherein the plurality of first signal wires are located on a side of the base distal to the driving substrate, the first conductive coupling elements comprises a plurality of first conductive coupling elements which are located on the base and electrically coupled to the plurality of first signal wires in a one-to-one correspondence; and the driving substrate further comprises a plurality of second conductive coupling elements which are located on a side of the PCB facing the base and are electrically coupled to the driving control element, wherein the plurality of second conductive coupling elements are electrically coupled to the plurality of first conductive coupling elements in a one-to-one correspondence.

16. The LED display device of claim 15, wherein the PCB comprises a first central region and a first peripheral region surrounding the first central region, and the LED display substrate is located in the first central region of the PCB, the second conductive coupling elements are located in the first peripheral region, and the plurality of first conductive coupling elements are electrically coupled to the plurality of second conductive coupling elements through conductive jumpers, respectively.

17. The LED display device of claim 16, wherein the LED display substrate comprises a second central region and a second peripheral region, the plurality of LED chips are located in the second central region and the first conductive coupling elements are located in the second peripheral region, wherein the first selection area, the second selection area, the third selection area, and the fourth selection area, which are spaced apart from one another, are provided in the second peripheral region, the selected number of first conductive coupling elements in each of the first selection area, the second selection area, the third selection area and the fourth selection area are electrically coupled to a selected number of first signal wires through conductive jumpers respectively.

18. The LED display device of claim 17, further comprising a protective adhesive layer, wherein the protective adhesive layer covers the plurality of LED chips, the plurality of first signal wires, the plurality of first conductive coupling elements, the plurality of second conductive coupling elements and the conductive jumpers.

19. The LED display device of claim 18, wherein all the plurality of first pole signal wires are located in a same layer, all the plurality of second pole signal wires are in located a same layer, and the plurality of first pole signal wires and the plurality of second pole signal wires are located in different layers.

20. The LED display device of claim 19, wherein m=INT (M/2), INT (M/2) indicates rounding of a value of M/2, each of the LED chips is an LED flip chip, the first conductive coupling elements and the second conductive coupling elements are pads, and the base is a glass substrate.

* * * * *